(12) United States Patent
Samoilov et al.

(10) Patent No.: US 9,224,714 B2
(45) Date of Patent: Dec. 29, 2015

(54) SEMICONDUCTOR DEVICE HAVING A THROUGH-SUBSTRATE VIA

(71) Applicant: Maxim Integrated Products, Inc., San Jose, CA (US)

(72) Inventors: Arkadii V. Samoilov, Saratoga, CA (US); Tyler Parent, Beaverton, OR (US); Larry Y. Wang, San Jose, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 3 days.

(21) Appl. No.: 14/299,076

(22) Filed: Jun. 9, 2014

(65) Prior Publication Data
US 2014/0284793 A1    Sep. 25, 2014

Related U.S. Application Data

(63) Continuation of application No. 13/342,420, filed on Jan. 3, 2012, now Pat. No. 8,748,232.

(51) Int. Cl.
*H01L 23/48* (2006.01)
*H01L 23/00* (2006.01)
(Continued)

(52) U.S. Cl.
CPC .......... *H01L 24/81* (2013.01); *H01L 21/76898* (2013.01); *H01L 23/3128* (2013.01); *H01L 23/3135* (2013.01); *H01L 23/481* (2013.01); *H01L 23/49811* (2013.01); *H01L 24/05* (2013.01); *H01L 24/94* (2013.01); *H01L 25/0657* (2013.01); *H01L 25/50* (2013.01); *H01L 21/568* (2013.01); *H01L 21/6835* (2013.01); *H01L 24/03* (2013.01); *H01L 24/11* (2013.01); *H01L 24/13* (2013.01); *H01L 24/14* (2013.01); *H01L 24/16* (2013.01); *H01L 24/97* (2013.01); *H01L 2221/6834* (2013.01); *H01L 2221/6835* (2013.01); *H01L 2221/68327* (2013.01); *H01L 2221/68381* (2013.01); *H01L 2224/024* (2013.01); *H01L 2224/0239* (2013.01); *H01L 2224/02313* (2013.01); *H01L 2224/02331* (2013.01); *H01L 2224/02381* (2013.01); *H01L 2224/03828* (2013.01); *H01L 2224/0401* (2013.01); *H01L 2224/0508* (2013.01); *H01L 2224/05025* (2013.01); *H01L 2224/05124* (2013.01); *H01L 2224/05147* (2013.01);
(Continued)

(58) Field of Classification Search
CPC ................................ H01L 21/02063
USPC ........................................ 257/737
See application file for complete search history.

(56) References Cited

PUBLICATIONS

M. Bouchoucha, P. Chausse, S. Moureau, L-L. Chapelon, N. Sillon, O. Thomas; Reliability Study of 3D-WLP Through Silicon Via with Innovative Polymer Filling Integration; Electronic Components and Technology Conference; 2011; pp. 567-572.
(Continued)

*Primary Examiner* — Elias M Ullah
(74) *Attorney, Agent, or Firm* — Advent, LLP

(57) ABSTRACT

Semiconductor devices are described that include a via that extends only partially through the substrate. Through-substrate vias (TSV) furnish electrical interconnectivity to electronic components formed in the substrates. In implementations, the semiconductor devices are fabricated by first bonding a semiconductor wafer to a carrier wafer with an adhesive material. The semiconductor wafer includes an etch stop disposed within the wafer (e.g., between a first surface a second surface of the wafer). One or more vias are formed through the wafer. The vias extend from the second surface to the etch stop.

6 Claims, 9 Drawing Sheets

(51) Int. Cl.
  *H01L 21/768* (2006.01)
  *H01L 23/31* (2006.01)
  *H01L 25/065* (2006.01)
  *H01L 25/00* (2006.01)
  *H01L 23/498* (2006.01)
  *H01L 21/56* (2006.01)
  *H01L 21/683* (2006.01)

(52) U.S. Cl.
  CPC .......... *H01L2224/05155* (2013.01); *H01L 2224/11002* (2013.01); *H01L 2224/11334* (2013.01); *H01L 2224/11849* (2013.01); *H01L 2224/13022* (2013.01); *H01L 2224/13024* (2013.01); *H01L 2224/13025* (2013.01); *H01L 2224/13111* (2013.01); *H01L 2224/13147* (2013.01); *H01L 2224/14181* (2013.01); *H01L 2224/16145* (2013.01); *H01L 2224/16147* (2013.01); *H01L 2224/16225* (2013.01); *H01L 2224/16227* (2013.01); *H01L 2224/81* (2013.01); *H01L 2224/81191* (2013.01); *H01L 2224/94* (2013.01); *H01L 2224/97* (2013.01); *H01L 2225/06513* (2013.01); *H01L 2225/06541* (2013.01)

(56) References Cited

PUBLICATIONS

Through Silicon Via Technology: The Ultimate Market for 3D Interconnect; TechSearch International; Jan. 2008.

3DIC & TSV Interconnects 2010 Report Series; Yole Developpement; 2010.

SEMICONDUCTOR DEVICE HAVING A THROUGH-SUBSTRATE VIA

CROSS-REFERENCE TO RELATED APPLICATIONS

The present application is a continuation under 35 U.S.C. §120 of U.S. patent application Ser. No. 13/342,420, filed Jan. 3, 2012, entitled "SEMICONDUCTOR DEVICE HAVING A THROUGH-SUBSTRATE VIA," which is hereby incorporated by reference in its entirety.

BACKGROUND

Consumer electronic devices, in particular, mobile electronic devices such as smart phones, tablet computers, and so forth, increasingly employ smaller, more compact components to furnish their users with desired features. Such devices often employ three dimensional integrated circuit devices (3D IC). Three-dimensional integrated circuit devices are semiconductor devices that employ two or more layers of active electronic components. Through-substrate vias (TSV) interconnect electronic components on the different layers (e.g., different substrates) of the device allowing the devices to be integrated vertically as well as horizontally. Consequently, three-dimensional integrated circuit devices can provide increased functionality within a smaller, more compact footprint than do conventional two-dimensional integrated circuit devices.

SUMMARY

Semiconductor devices are described that include one or more vias that extend only partially through the substrate. The vias, which may be through-substrate vias (TSV), furnish electrical interconnectivity to electronic components formed in the substrates. In implementations, the semiconductor devices are fabricated by first bonding a semiconductor wafer to a carrier wafer with an adhesive material to provide mechanical support to the semiconductor wafer during later fabrication steps. The semiconductor wafer includes an etch stop disposed within the wafer (e.g., between a first surface and a second surface of the wafer). One or more vias are then formed through the wafer that extend from the second surface of the wafer to the etch stop.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

Through-silicon vias (TSVs) are vertical electrical interconnections utilized to create three dimensional (3D) integrated circuit devices. For example, an integrated circuit die may be stacked over a silicon wafer. By interconnecting the integrated circuit die with integrated circuits formed in the silicon wafer, the integrated circuit die and the integrated circuits in the silicon wafer behave as a single device. In an embodiment, a TSV may extend completely through the substrate (wafer or die) to provide electrical interconnections between integrated circuit devices formed in the substrate and other components associated with the integrated circuit devices (e.g., the integrated circuit die).

Accordingly, wafer-level packaging techniques are described to allow packaging of multiple die into a single wafer-level package device. The semiconductor devices include vias that extend partially through the substrate of the devices to allow for additional routing near a surface of the semiconductor device. In one or more implementations, the semiconductor devices are fabricated by first bonding a semiconductor wafer to a carrier wafer with an adhesive material. The semiconductor wafer includes an etch stop disposed within the wafer (e.g., between a first surface a second surface of the wafer). Then, one or more vias are formed through the wafer that extend from about the second surface to the etch stop. In one or more implementations, an integrated circuit die is disposed over the second surface of the wafer. An encapsulation structure may be formed over the second surface to at least substantially encapsulate the integrated circuit die. A stiffener may be formed over the encapsulation structure to furnish mechanical support to the device. In an implementation, the stiffener may be fabricated from an Alloy forty-two (42) composition.

In the following discussion, an example semiconductor device is first described. Exemplary procedures are then described that may be employed to fabricate the example semiconductor device.

Example Implementations

Figure 1:
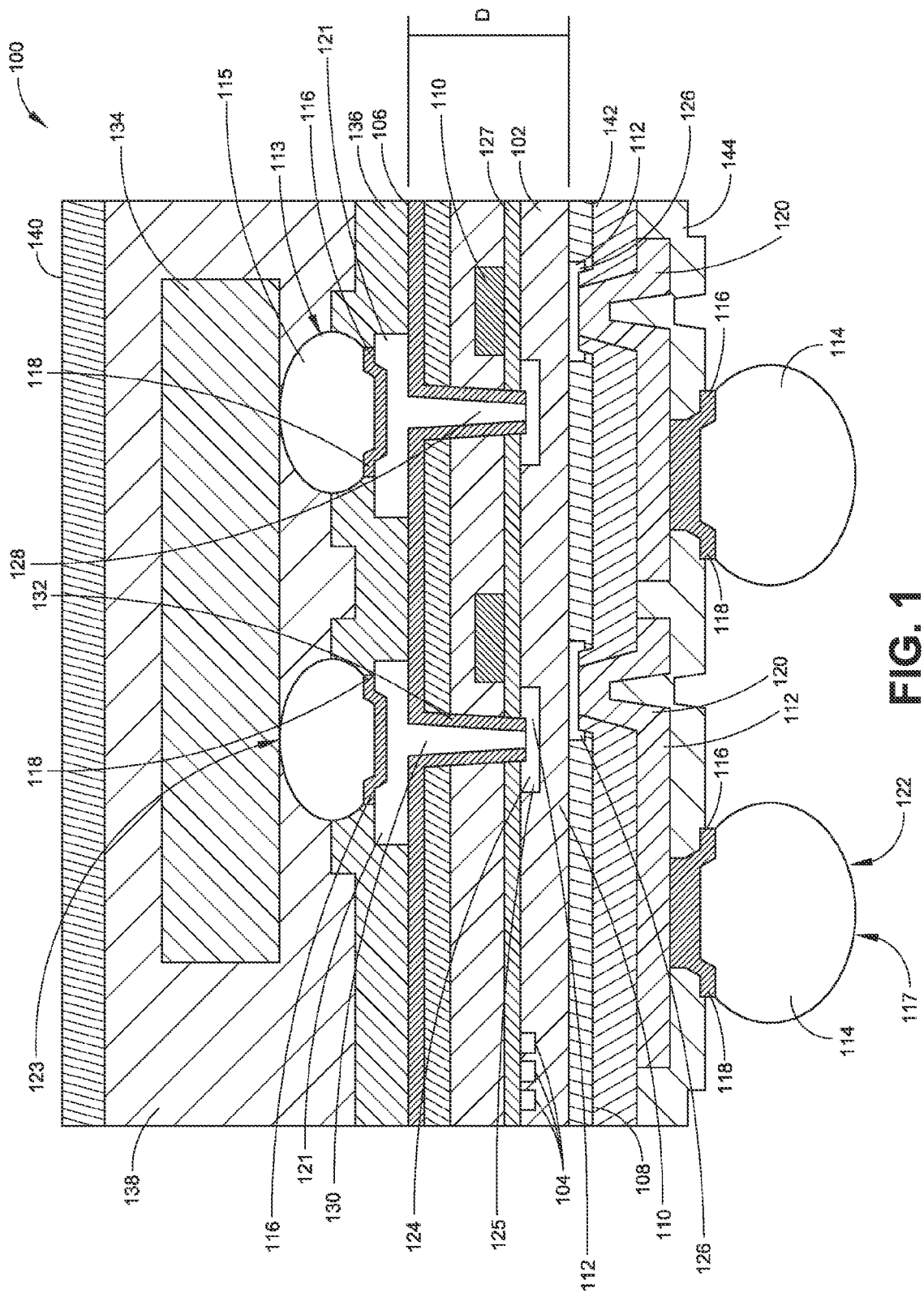
FIG. 1 is a diagrammatic partial cross-sectional view illustrating a semiconductor device having one or more vias in accordance with an example implementation of the present disclosure.

FIG. 1 illustrates a semiconductor device 100 in accordance with example implementations of the present disclosure. As shown, the semiconductor device 100 includes a substrate 102 (e.g., a portion of a semiconductor wafer). The substrate 102 includes alignment marks 104 that allow for alignment of the substrate 102 during semiconductor fabrication processes. The substrate 102 also includes a first surface 106 and a second surface 108.

The substrate 102 comprises a base material utilized to form integrated circuit devices 110 through various fabrication techniques such as photolithography, ion implantation, deposition, etching, and so forth. The substrate 102 may be configured in a variety of ways. For example, the substrate 102 may comprise an n-type silicon wafer or a p-type silicon wafer. In an implementation, the substrate 102 may comprise group V elements (e.g., phosphorus, arsenic, antimony, etc.) configured to furnish n-type charge carrier elements. In another implementation, the substrate 102 may comprise group IIIA elements (e.g., boron, etc.) configured to furnish p-type charge carrier elements.

The integrated circuit devices 110 may be configured in a variety of ways. For example, the integrated circuit devices 110 may be digital integrated circuit devices, analog integrated circuit devices, mixed-signal circuit devices, and so forth. In implementations, the integrated circuit devices may comprise digital logic devices, analog devices (e.g., amplifiers, etc.), combinations thereof, and so forth. As described above, the integrated circuit devices 110 may be fabricated utilizing various fabrication techniques (e.g., front-end-of-line (FEOL) fabrication techniques). For example, the integrated circuit devices 110 may be fabricated through complementary metal-oxide-semiconductor (CMOS) techniques, bi-polar semiconductor techniques, and so on.

As shown in FIG. 1, the device 100 also includes conductive layers 112. In an implementation, the conductive layers 112 may comprise conductive (e.g., contact) pads, redistribution structures, or the like. In a further implementation, the conductive layers 112 may include seed metal and/or barrier metal layers to allow for plated-line formation. The number and configuration of the conductive layers 112 may vary depending on the complexity and configuration of the integrated circuit devices 110, and so forth. The conductive layers 112 may provide electrical interconnections through which the integrated circuit devices 110 are interconnected to other electronic components associated with the device 100, such as printed circuit boards, or other integrated circuit devices 110 that are disposed within the device 100. In implementations, the conductive layers 112 may comprise an electrically conductive material, such as a metal material (e.g., aluminum, copper, etc.), or the like.

As described above, the conductive layers 112 furnish electrical interconnection between various electrical components associated with the device 100. For instance, a first conductive layer 112 deployed over the second surface 108 may furnish an electrical interconnection between an integrated circuit device 110 to solder bumps 114. Solder bumps 114 and micro-solder bumps 115 are provided to furnish mechanical and/or electrical interconnection between the conductive layers 112 and corresponding pads formed on the surface of a printed circuit board. In an implementation, the solder bumps 114 and micro-solder bumps 115 may be fabricated of a lead-free solder such as a Tin-Silver-Copper (Sn—Ag—Cu) alloy solder (i.e., SAC), a Tin-Silver (Sn—Ag) alloy solder, a Tin-Copper (Sn—Cu) alloy solder, and so on. However, it is contemplated that Tin-Lead (PbSn) solders may be used. As shown in FIG. 1, a first array 113 of micro-solder bumps 115 are disposed over the first surface 106 and a second array 117 of solder bumps 114 are disposed over the second surface 108 of the device 100.

Bump interfaces 116 may be applied to the conductive layers 112 to provide a reliable interconnect boundary between the conductive layers 112 and the solder bumps 114. For instance, in the semiconductor device 100 shown in FIG. 1, the bump interface 116 comprises under-bump metallization (UBM) 118 applied to the conductive layers 112 of the substrate 102. The UBM 118 may have a variety of compositions. For example, the UBM 118 include multiple layers of different metals (e.g., Aluminum (Al), Nickel (Ni), Copper (Cu), etc.) that function as an adhesion layer, a diffusion barrier layer, a solderable layer, an oxidation barrier layer, and so forth. However, other UBM structures are possible. In another implementation, the bump interfaces 116 may comprise copper pillars, or the like.

In implementations, the device 100 may employ a conductive layer 112 implemented in a Redistribution Layer ("RDL") configuration. The RDL configuration employs a redistribution structure 120 comprised of a thin-film metal (e.g., aluminum, copper, etc.) rerouting and interconnection system that redistributes the conductive layers 112 to an area array of bump interfaces 116 (e.g., UBM pads) that may be more evenly deployed over the surface of the device 100. As shown in FIG. 1, the device 100 may also include a RDL structure 121 disposed over the first surface 106 to further provide electrical interconnection functionality to components (e.g., integrated circuit devices 110, TSVs, etc.) associated with the device 100.

The solder bumps 114 and the micro-solder bumps 115 are subsequently placed over these bump interfaces 116 to form bump assemblies 122 and bump assemblies 123, respectively. Thus, viewed together, the solder bumps 114, the micro-solder bumps 115, and associated bump interfaces 116 (e.g., UBM 118, copper pillars) comprise bump assemblies 122, 123, respectively, that are configured to provide mechanical and/or electrical interconnection of the integrated circuit devices 110 to other electronic devices, such as a printed circuit board or another die (as described herein).

While FIG. 1 illustrates a device 100 that employs a Redistribution Layer ("RDL") configuration, it is contemplated that the device 100 illustrated and described herein may also employ a Bump-On-Pad ("BOP") configuration. The BOP configuration may employ a conductive layer 112 disposed under the bump interface 116 (e.g., UBM pads).

Conductive pads 124, 126 (e.g., conductive layers 112) may be disposed in the substrate 102. As shown in FIG. 1, the conductive pads 124 are disposed within the substrate 102 and the conductive pads 126 are disposed near the surface 108. In some implementations, the conductive pads 126 are disposed over a surface of the substrate 102. The conductive pads 124, 126 may be configured in a variety of ways. In an example, the conductive pads 124, 126 may be comprised of aluminum. In another example, the conductive pads 124, 126 may be comprised of copper. However, other examples are possible.

As shown in FIG. 1, through-substrate vias (TSVs) 128 extend from the surface 106 to the conductive pads 124. Thus, the conductive pads 124 may be configured to function as an etch stop 125 during formation of the through-silicon vias 128 (TSVs). In one or more implementations, the etch stop 125 may comprise a metal 1 layer, a metal 2 layer, a metal 3 layer, a metal 4 layer, or the like. The conductive pads 124 also serve to provide electrical interconnection functionality between a TSV 128 (which is connected to a solder bump 114 of the first array 113 of bump assemblies 122) and other associated electronic components (e.g., integrated circuit devices 110). As shown, the TSVs 128 do not extend the entire depth (D) of the substrate 102 (e.g., a TSV 128 extends only partially through the substrate 102). For instance, in one example, the TSVs 128 may have a depth of about fifty microns (50 um) to about one hundred microns (100 um), while the depth (D) of the substrate 102 is about sixty-five microns (65 um) to about one hundred and twenty microns (120 um). However, it is contemplated that in other example implementations, the depths of the TSVs 128 and the substrate 102 may vary depending on various applications. In this manner, additional routing (e.g., additional RDL structures 120) and/or additional integrated circuits devices (e.g., integrated circuit devices 110) may be disposed near the second surface 108 of the substrate 102 due to additional space realized from the TSVs 128 not extending the entire depth of the substrate 102. The TSVs 128 may be configured in a variety of ways. For instance, in one specific example, the TSVs 128 may have an aspect ratio ranging from about four to one (4:1)

to ten to one (10:1). In implementations, the conductive pads 124 may comprise a metal layer, such as copper, aluminum, or the like.

FIG. 1 also illustrates a dielectric layer 127 (e.g., an inter-layer) that is disposed above the conductive pad 124 and extends at least substantially the width of the substrate 102. As shown, the dielectric layer 127 is positioned proximate to (e.g., adjacent or above) the conductive pads (etch stops 125). The dielectric layer 127 may be utilized to slow the etch rate of the TSVs 128. For example, during a fabrication step, a first TSV 128 and a second TSV 128 may be formed. However, a first etch rate (of the first TSV 128) may be faster (e.g., greater) than a second etch rate (of the second TSV 128). Thus, the dielectric layer 127 may manage to slow the first etch rate such that the second etch rate is approximately equal to the first etch rate (e.g., the etch rates may be approximately equal when the etching material encounters the etch stops). In one or more implementations, the dielectric layer 127 may comprise multiple layers of at least one of: silicon nitride, phosphorous doped silicon oxide, or undoped silicon oxide.

As shown in FIG. 1, the conductive pads 126 are disposed near (e.g., over) the second surface 108 and serve to provide electrical interconnection functionality between the RDL structures 120 and other electronic components of the device 100. In an embodiment, the conductive pads 126 may be disposed over a surface of the substrate 102. The conductive pads 126 may provide an electrical interconnection between a RDL structure 120 and an integrated circuit device 110 that is disposed between a conductive pad 124 (etch stop 125) and a conductive pad 126.

As described above, the through-silicon via 128 (TSV) extends partially through the substrate 102 to at least one conductive layer 112 such as the etch stop 125 of the substrate 102. For example, the TSV 128 is illustrated as being disposed within the substrate 102 and extends to the etch stops 125. Thus, in an implementation, the TSV 128 (TSVs 128) does not extend through the substrate 102 (e.g., the TSV 128 does not extend from the surface 106 to the surface 108). As shown in FIG. 1, the TSV 128 includes a conductive material 130 that furnishes an electrical interconnection between a first conductive layer 112 (e.g., conductive pad 124) of the substrate 102 and a solder bump 114 of the first array 113 of bump assemblies 123. The conductive material 130 extends vertically through the TSV 128 as well as horizontally over the first surface 106. The portion of the conductive material 130 extending horizontally over the first surface 106 serves to function as the RDL structure 121. For instance, the conductive material 130 may provide an electrical interconnection between an integrated circuit device 110 and a solder bump 114. In an implementation, the conductive material 130 may comprise a metal material, such as copper, or the like.

The TSV 128 includes an insulating liner 132 to electrically isolate the conductive material 130 disposed in the TSVs 128 from the top wafer 104. Thus, the insulating liner 132 serves to prevent shorting of the conductive material 130 with the substrate 102. As illustrated in FIG. 1, the insulating liner 132 is deposited in the TSVs 128 such that the liner 132 at least substantially lines the TSVs 128. The insulating liner 132 may be configured in a variety of ways. For example, the insulating liner 132 may be an insulating material, such as an oxide material ($SiO_2$), a nitride material, combinations thereof, or the like. The insulating liner 132 is formed by depositing the insulating material in the TSVs 128 and then etching the insulating material at the bottom of the TSVs 128 while preserving the insulating liner 132 along the sides of the TSVs 128. In one or more implementations, the insulating material may be deposited via plasma enhanced chemical vapor deposition (PECVD) techniques and then anisotropically etching the insulating material down to the conductive pad 124 to form the liner 132.

The first array 113 of bump assemblies 123 may be in electrical contact with an integrated circuit die 134 to extend system on a chip (SoC) capabilities to the device 100. For instance, the integrated circuit die 134 may be comprised of digital circuitry, analog circuitry, or mixed-signal circuitry.

Additionally, as shown in FIG. 1, the device 100 includes a polymer layer 136 disposed over the first surface 106 to furnish stability to the first array 113 of bump assemblies 123. In one or more implementations, a low temperature polybenzobisoxazole (PBO) process may be utilized to form the polymer layer 136 over the first surface 106. The low temperature PBO process may occur in temperatures ranging from about one hundred and fifty degrees Celsius (150° C.) to about two hundred degrees Celsius (200° C.). In an implementation, the low temperature PBO process may occur at a temperature of about one hundred and seventy-five degrees Celsius (175° C.). The low temperature PBO process serves to form the polymer layer 136 while not harming already completed fabrication steps (integrated circuit devices 110, temporary adhesive layer (see temporary adhesive layer 322 in FIG. 3C).).

An encapsulation structure 138 is disposed over the polymer layer 136 to provide support and to at least substantially hold the integrated circuit die 134 in position. As shown in FIG. 1, the encapsulation structure may at least substantially encapsulate the integrated circuit die 134. In one or more implementations, the encapsulation structure 138 may be comprised of a suitable molded composition, or the like.

As illustrated in FIG. 1, the device 100 further includes a stiffener 140 disposed over the encapsulation structure 138 to furnish mechanical support to the device 100. The stiffener 140 may have a coefficient of thermal expansion (CTE) that is comparable to the CTE of the device 100 (e.g., substrate 102, etc.). Thus, the stiffener 140 may be configured in a variety of ways. For example, the stiffener 140 may comprise a silicon material that has a CTE comparable to the CTE of the device 100. In another example, the stiffener 140 may be comprised of a metal composition that has a CTE comparable to the CTE of the device 100. In an implementation, the metal material may be Alloy forty-two (42) composition (e.g., a nickel iron (Ni—Fe) alloy), or the like.

The semiconductor device 100 also includes a first and second polymer layers 142, 144 to furnish insulation to the one or more conductive layers 112 (e.g., RDL structure 120, conductive pads 126). For example, the polymer layers 142, 144 may be utilized to insulate the one or more conductive layers 112 from later processing steps. In an implementation, the polymer layers 142, 144 may be formed through a low temperature PBO process, or the like.

Example Fabrication Processes

Figure 2A:
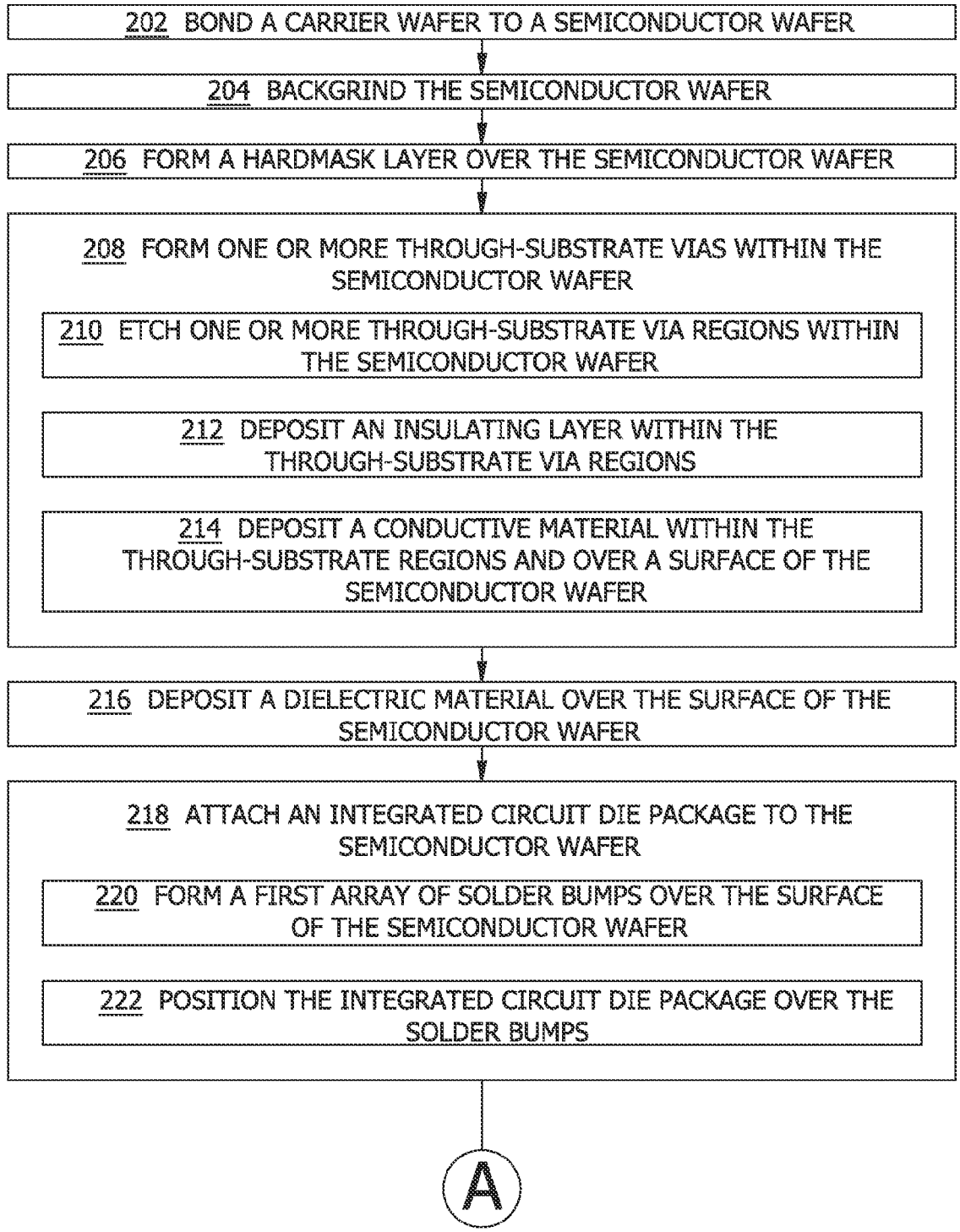
FIGS. 2A and 2B are flow diagrams illustrating a process in an example implementation for fabricating semiconductor devices having one or more vias, such as the device shown in FIG. 1.
Figure 2B:
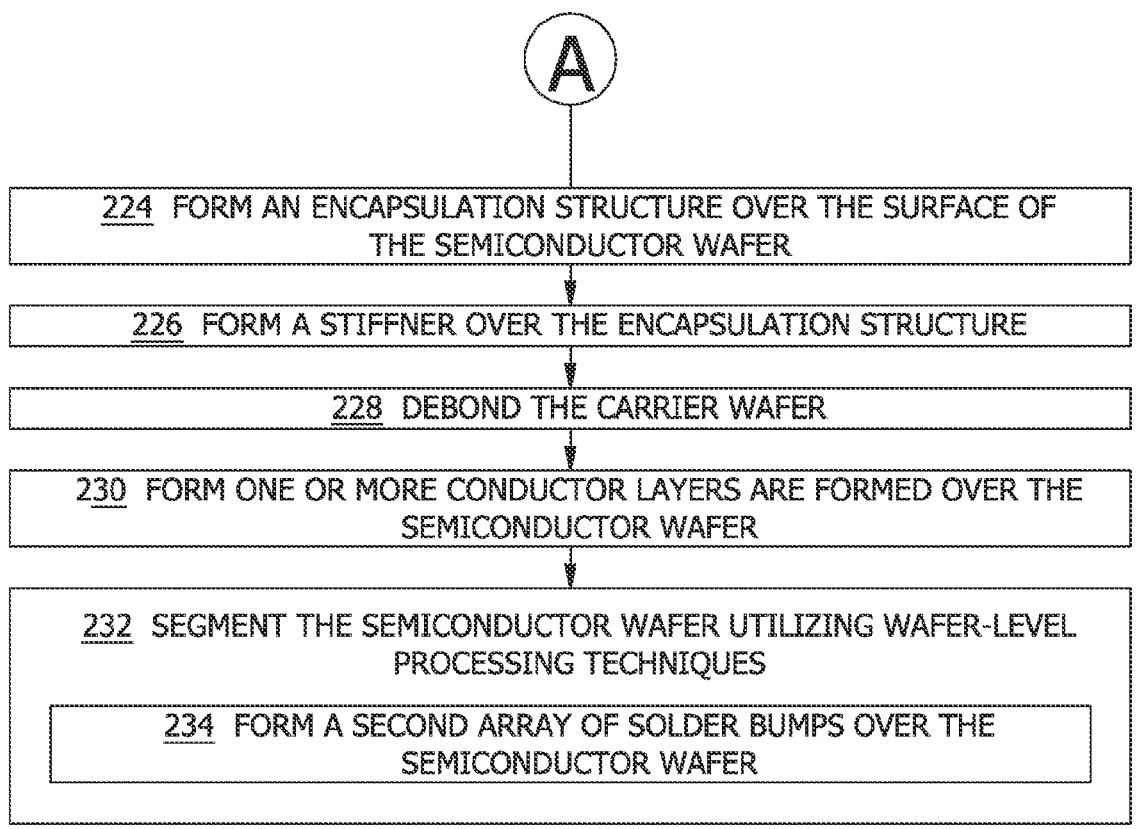

FIGS. 2A and 2B illustrate an example process 200 that employs wafer-level packaging techniques to fabricate semiconductor devices, such as the semiconductor device 100 shown in FIG. 1. FIGS. 3A through 3F illustrate sections of example wafers that may be utilized to fabricate semiconductor devices 300 (such as the semiconductor device 100 shown in FIG. 1). A semiconductor wafer, such as wafer 302 shown in FIG. 3A, includes a first surface 304 and a second surface 306. The wafer 302 also includes one or more integrated circuit devices 308 formed through FEOL fabrication techniques. For example, the integrated circuit devices 308 may be fabricated through complementary metal-oxide-semiconductor (CMOS) techniques, bi-polar semiconductor techniques, and so on. In one or more implementations, the integrated circuit devices 308 may comprise digital logic devices, analog devices (e.g., amplifiers, etc.), combinations thereof, and so forth.

Figure 3A:
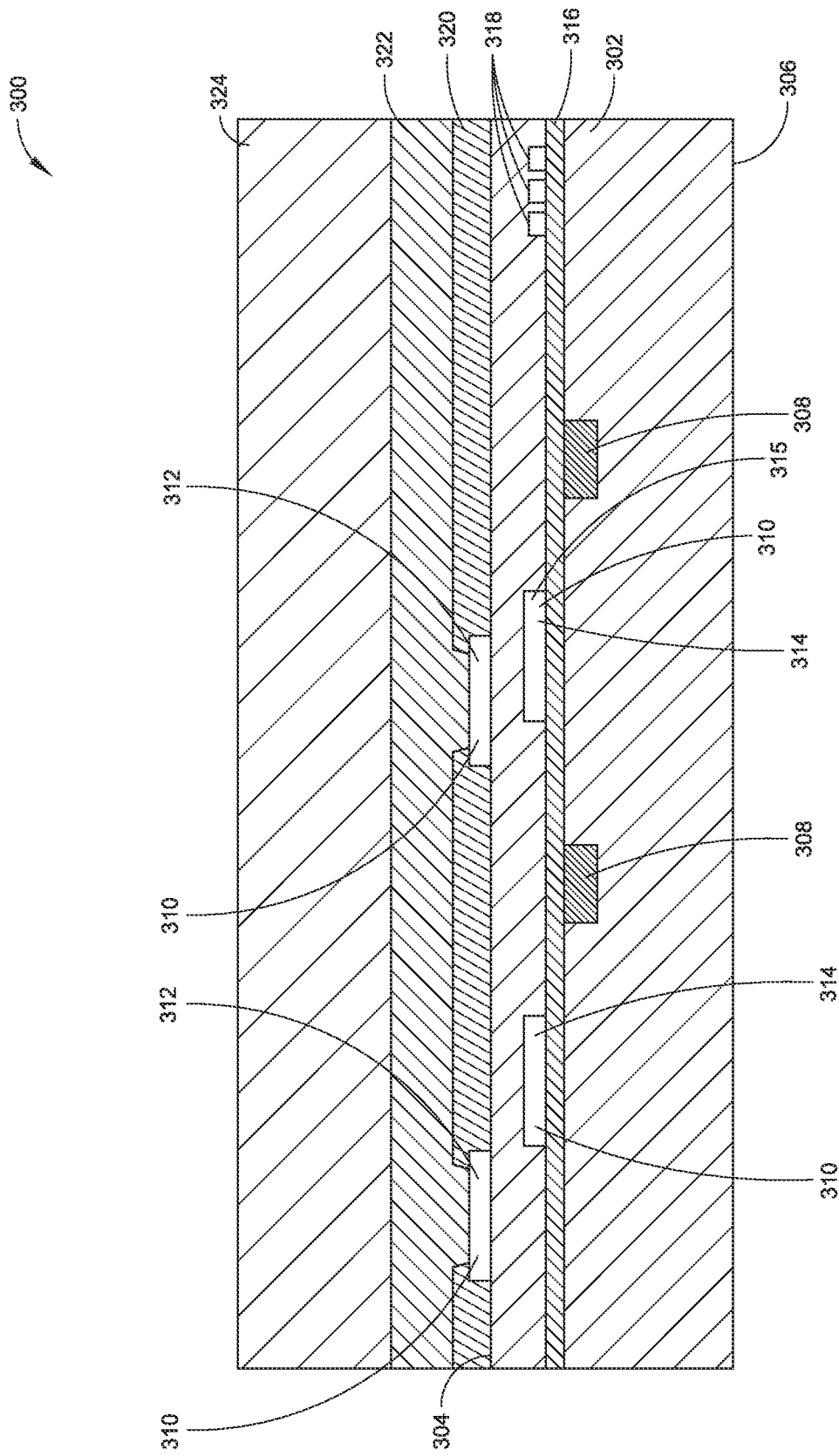
FIG. 3A through 3F are diagrammatic partial cross-sectional views illustrating the fabrication of a semiconductor device having one or more vias such as the device shown in FIG. 1, in accordance with the process shown in FIG. 2.

As shown in FIG. 3A, the devices 300 also include multiple conductive layers 310. The conductive layers 310 include a first (e.g., topmost pad as shown in FIG. 3A) conductive pad(s) 312 and a second (e.g., bottommost pad as shown in FIG. 3A) conductive pad(s) 314. In one or more implementations, the conductive pads 312, 314 may be aluminum, or the like. As shown, the first conductive pad(s) 312 are disposed over the first surface 304, and the second conductive pad(s) 314 are disposed within the wafer 302 to function as an etch stop (e.g., etch stop 315) during formation of one or more TSVs (described herein). As shown, the second conductive pad(s) 314 are disposed proximate (e.g., adjacent or near) a dielectric layer 316, which is configured to manage one or more etch rates during formation of the TSVs. For example, a first etch rate of a first TSV may be faster (e.g., greater) than a second etch rate of a second TSV. Thus, the dielectric layer 316 may manage to slow the first etch rate such that the second etch rate is approximately equal to the first etch rate as described above. The dielectric layer 316 may also include a diffusion barrier material (e.g. silicon nitride, silicon carbide, etc.) to protect the integrated circuit devices 308 formed through FEOL fabrication techniques from contamination introduced during the metallization and interlayer dielectric deposition. The devices 300 may also include alignment marks 318 to align the wafer 302 during later fabrication processes (e.g., bonding to a carrier wafer, formation of the TSVs, etc.). In an implementation, visible light and/or infrared light alignment techniques may be utilized to align the wafer 302.

As shown in FIG. 2A, a carrier wafer is bonded to a semiconductor wafer (Block 202). As shown in FIG. 3A, a passivation layer 320 is disposed over the first surface 304 of the first conductive pad(s) 312. The passivation layer 320 initially at least substantially encapsulates the conductive pad(s) 312 before the passivation layer 320 is selectively etched to at least partially expose the conductive pad(s) 312. A suitable temporary adhesive layer 322 is deposited over the passivation layer 320 to allow a carrier wafer 324 to be bonded to the semiconductor wafer 302. In an implementation, the carrier wafer 324 may be a silicon wafer, or the like.

Figure 3B:
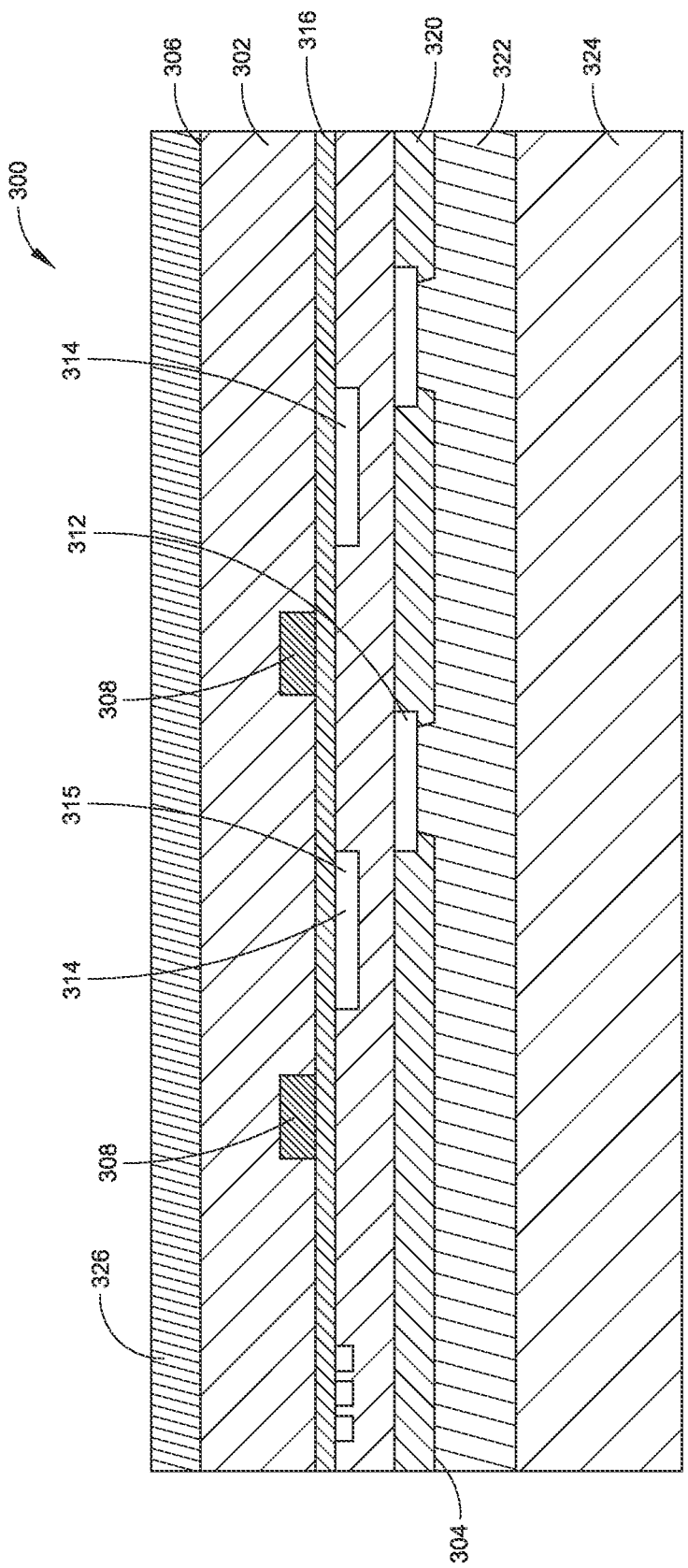

The semiconductor wafer is then subjected to a suitable backgrinding process (Block 204). As shown in FIG. 3B, the second surface 306 of the wafer 302 is subjected to a backgrinding process to thin the wafer 302. A hardmask layer is then formed over the second surface of the semiconductor wafer (Block 206). A hardmask layer 326 is formed over the surface 306 to protect portions of the wafer 302 during formation of the TSVs (see FIG. 3B). In an implementation, the hardmask layer 326 may be comprised of a dual oxide-nitride hardmask, or the like.

Figure 3C:
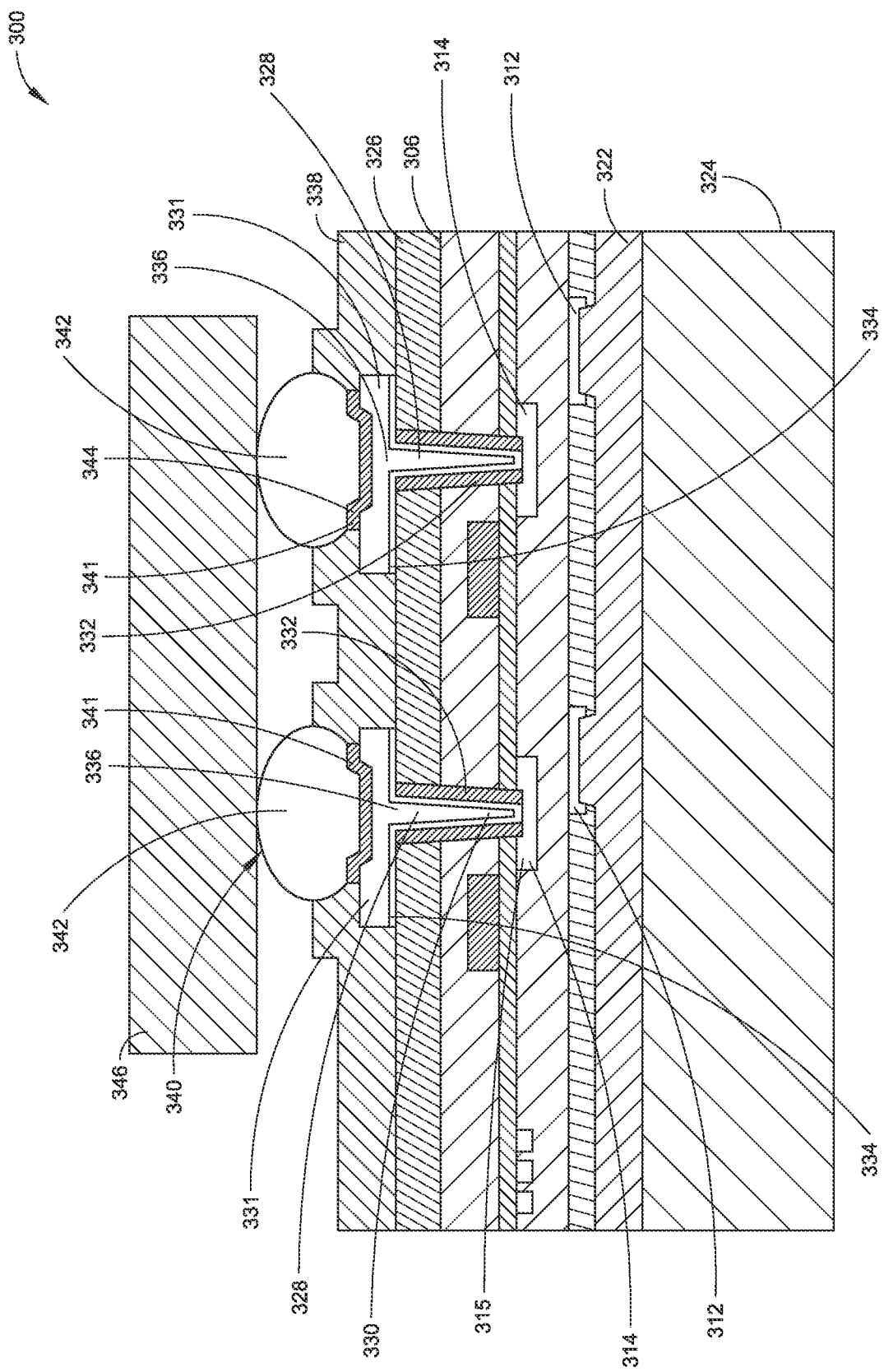

One or more TSVs are then formed within the semiconductor wafer (Block 208). The TSVs may be formed by etching TSV regions in the semiconductor wafer (Block 210). For example, a photoresist layer is formed over the hardmask layer 326. The TSV regions 328 are formed by selectively patterning and etching photoresist layer regions (e.g., unexposed regions of the photoresist layers) to begin formation of the TSVs 330. As shown in FIG. 3C, the TSVs 330 extend from about the second surface 306 to the second conductive pads 314 (e.g., etch stops 315).

An insulating layer is deposited within the TSV regions (Block 212). As shown in FIG. 3C, an insulating layer 332 is deposited within the TSVs 330 to electrically isolate the TSVs 330 from the wafer 302. In an implementation, the insulating layer 332 may be an oxide layer ($SiO_2$), or the like. An anisotropic dry etch process is used to clear the insulating layer from the bottom of the TSV while retaining this insulating layer on the sidewalls of the TSV. Next, a diffusion barrier metal 334 (e.g., Ti, etc.) and a seed metal 334 are deposited over the second surface 306. The diffusion barrier metal 334 and seed metal 334 may be patterned (through suitable lithography steps) to provide electrical interconnections between various components (e.g., integrated circuit devices 308, solder bumps, etc.).

A conductive material is deposited within the TSV regions and over the second surface (Block 214). As shown in FIG. 3C, a conductive material 336 is deposited within the TSV regions 328 to form TSVs 330 (e.g., forming a via for electrical interconnection functionality) and over the second surface 306 to form a RDL structure 331 (e.g., the TSV 330 fill and the formation of the RDL structure 331 may be accomplished in a single plating (e.g., copper plating) process). The RDL structure 331 may serve to provide an electrical interconnection between the TSVs 330, which are in electrical communication with the integrated circuit devices 308, and one or more solder bumps (described herein). In one or more implementations, the conductive material 336 may be deposited through one or more suitable plating techniques. For example, a copper material may be copper plated to deposit the conductive material 336 within the TSVs 330 and over the second surface 306. Thus, the conductive material 336 may serve as an electrical interconnection within the TSVs 330 as well as function as a redistribution structure.

A dielectric material is deposited over the second surface of the semiconductor wafer (Block 216). A shown in FIG. 3C, a dielectric material 338 is deposited over the second surface 306 of the semiconductor wafer 302. In an implementation, the dielectric material 338 may be a low temperature polybenzobisoxazole (PBO). The dielectric layer 338 may be patterned and etched (through suitable lithography processes) to at least partially expose the conductive material 336.

As shown in FIG. 2A, an integrated circuit die is attached to the semiconductor wafer (Block 218). Attachment of the integrated circuit die includes forming a first array of solder bumps over the second surface (Block 220). A first array 340 of mini-solder bumps 342 are formed over the second surface 306 (e.g., over the etched portions of the dielectric layer 338). For example, one or more mini-solder balls (pre-reflowed mini-solder bumps 342) are positioned (through a solder ball placement stencil, or the like) over the etched portions of the dielectric layer 338 that at least partially expose the conductive material 336. It is contemplated that flux may be applied to the conductive material 336 to remove oxidation from the surface of the exposed conductive material 336 regions. The mini-solder balls are then reflowed to form mini-solder bumps 342. The conductive material 336 may be patterned to form a bump interface 341. For example, the bump interface 341 may be configured as an UBM 344. In another example, the bump interface 341 may be configured as a copper pillar. An integrated circuit die is then positioned over the solder bumps (Block 222). As shown in FIG. 3C, an integrated circuit die 346 is positioned over the mini-solder bumps 342. The mini-solder bumps 342 are configured to furnish electrical interconnection functionality between the integrated circuit die 346 and the TSVs 330. The integrated circuit die 346 may be configured in a variety of ways. For example, the integrated circuit die 346 may be a digital integrated circuit die. In another example, the integrated circuit die 346 may be an analog integrated circuit die. In yet another example, the integrated circuit die 346 may be a mixed-signal integrated circuit die.

As shown in FIG. 2B, an encapsulation structure is formed over the second surface of the semiconductor wafer (Block 224). An encapsulation structure 348 is then formed over the second surface 306 (e.g., over the dielectric layer 338) to encapsulate the integrated circuit die 346 (see FIG. 3D). Thus, the encapsulation structure 348 may at least substantially hold the integrated circuit die 346 in position while insulating the integrated circuit die 346 from further processing steps. In an implementation, the encapsulation structure 348 may be comprised of a suitable molded compound, or the like.

Figure 3D:
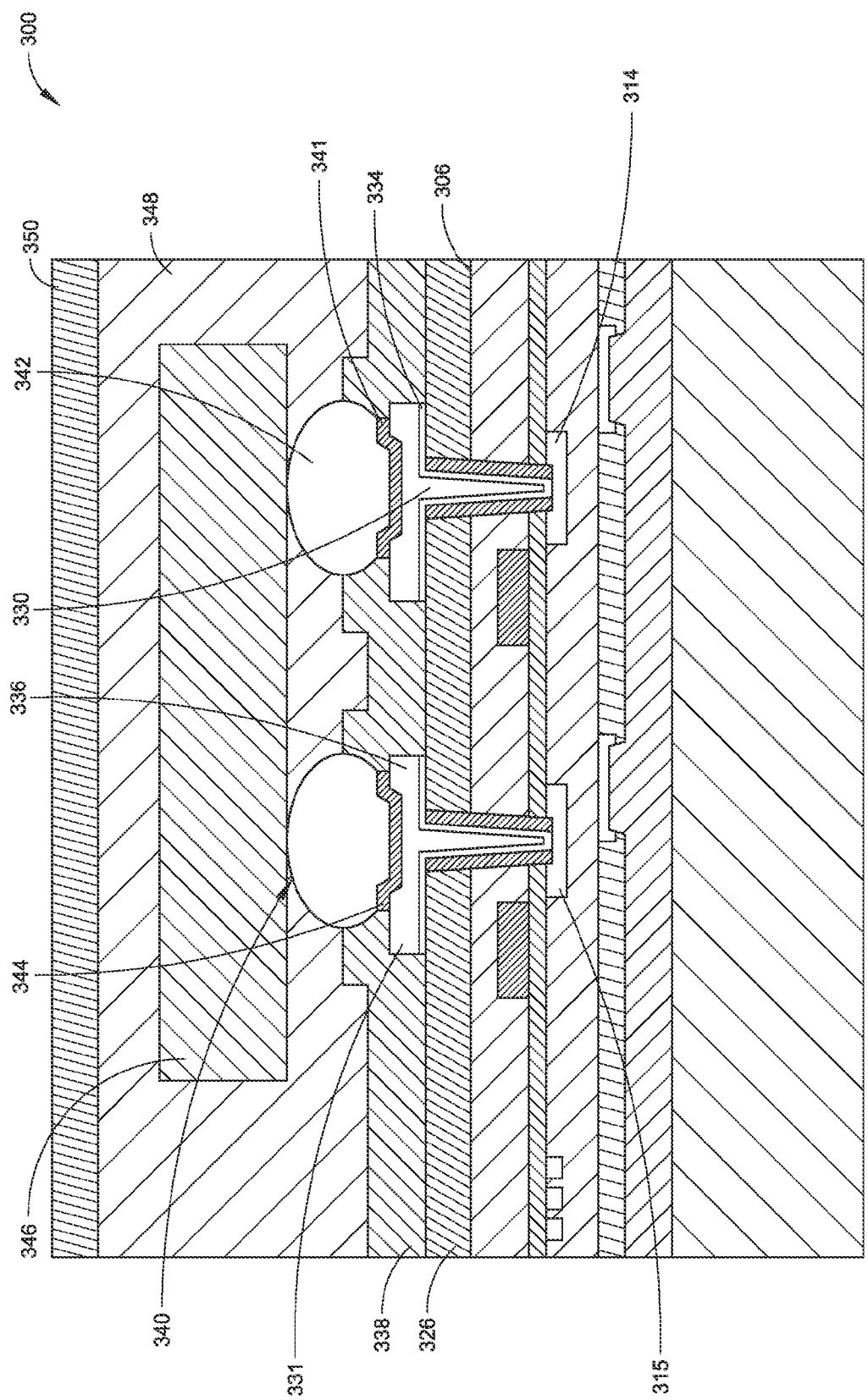

A stiffener is deposited over the encapsulation structure (Block 226). As shown in FIG. 3D, a stiffener 350 is deposited (e.g., formed) over the encapsulation structure 348 to furnish mechanical strength to the device 300. As described above, the stiffener 350 may have a CTE that is comparable to the CTE of the device 300 (e.g., wafer 302). In one or more implementations, the stiffener 350 may be a silicon material or a metal material (e.g., Alloy 42).

Figure 3E:
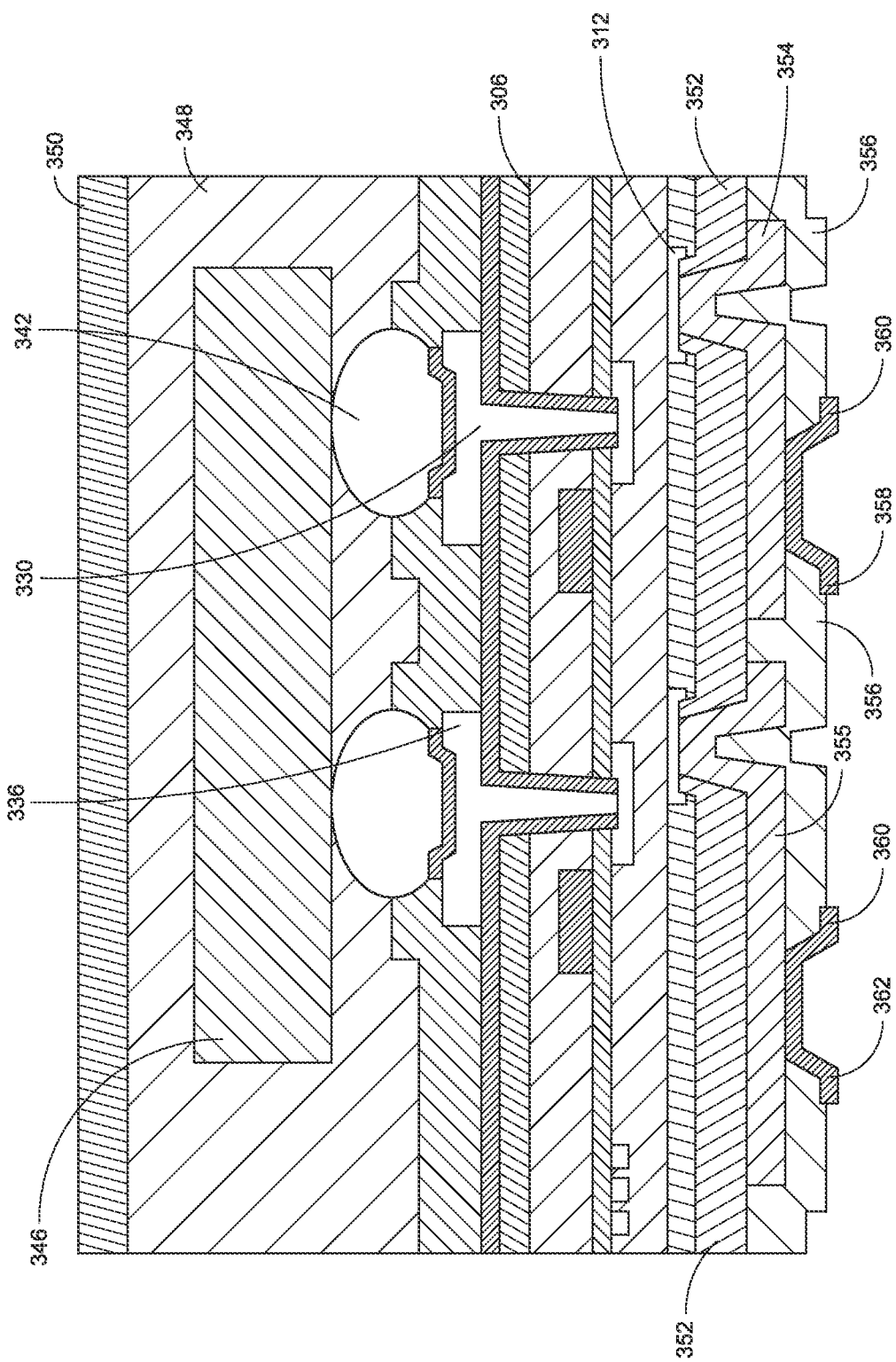
Figure 3F:
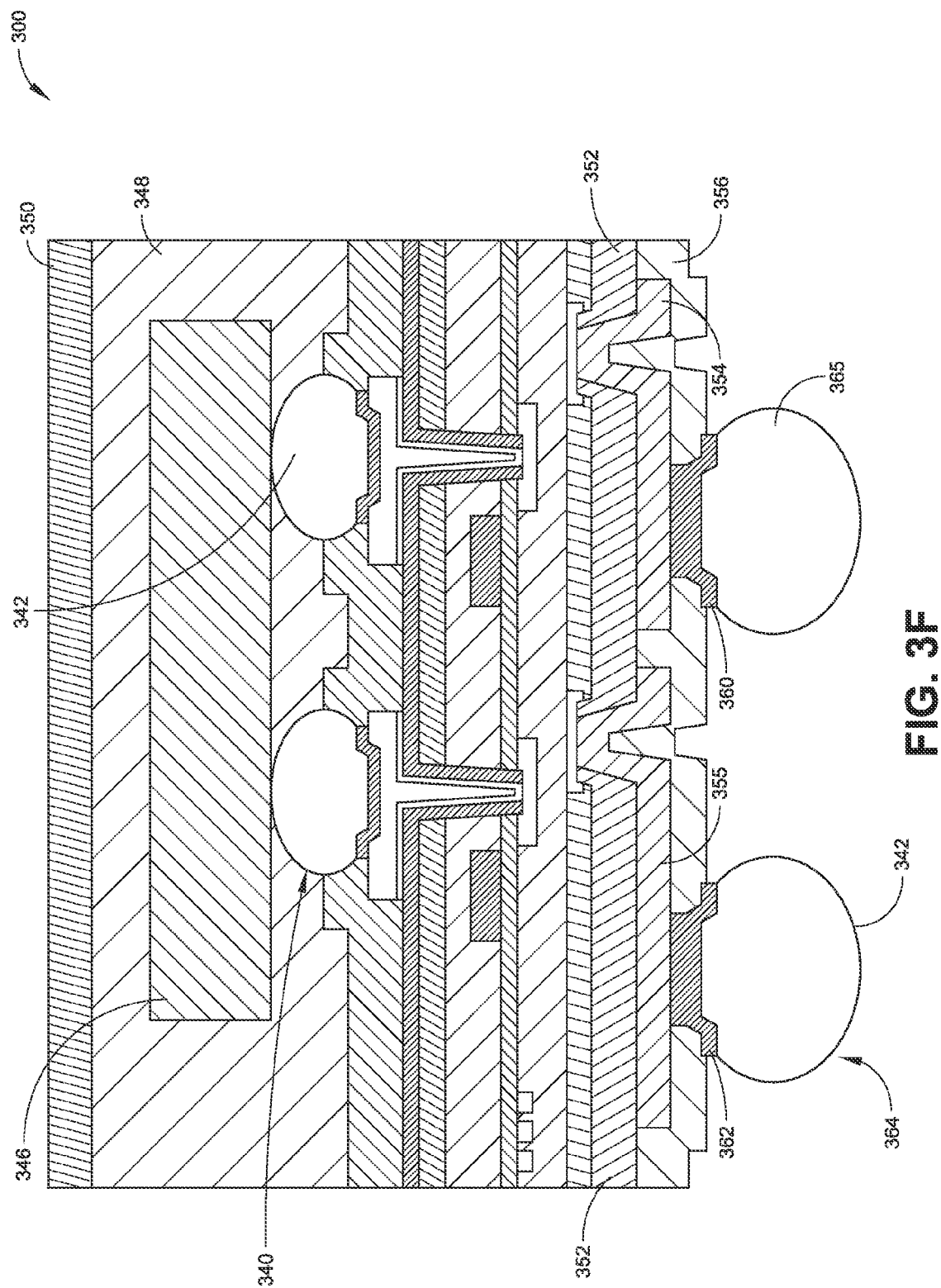

The carrier wafer is then debonded (e.g., removed) from the semiconductor wafer (Block 228). For example, the carrier wafer 324 may be debonded from the wafer 302 by heating the temporary adhesive layer 322 sufficiently to allow for removal of the carrier wafer 324 (see FIG. 3E). Once the carrier wafer is removed, one or more conductive layers are formed over the first surface of the semiconductor wafer (Block 230). As shown in FIG. 3E, a first polymer layer 352 may be deposited over the first surface 304 and selectively patterned to at least partially expose the first conductive pad(s) 312. Once the first conductive pad(s) 312 are at least partially exposed, a conductive layer 354 may be formed (e.g., deposited and patterned) over the polymer layer 352. As described above, a diffusion barrier metal and a seed metal (e.g., such as diffusion barrier metal 334 and a seed metal 334) may first be deposited and patterned before deposition of the conductive layer 354. In an implementation, the conductive layer 354 may be configured as a redistribution structure 355, or the like. Once the conductive layer 354 is formed over the polymer layer 352, a second polymer layer 356 may be deposited over the polymer layer 352 and the conductive layer 354. The polymer layer 356 is then patterned to at least partially expose the conductive layer 354. In an implementation the first and second polymer layers 352, 356 may be formed through one or more suitable low temperature PBO processes. A conductive layer 358 is then deposited over the polymer layer 356 and patterned to form a bump interface 360. In an implementation, the bump interface 360 may be configured as a UBM 362 (see FIG. 3E). In another implementation, the bump interface 360 may be configured as a copper pillar.

As shown in FIG. 2B, suitable wafer-level packaging processes may be employed to segment and package the individual semiconductor devices (Block 232). For example, a second array of solder bumps are formed over the first surface of the semiconductor wafer (Block 234). The second array 364 of solder bumps 365 are formed over the conductive layer 358 (e.g., bump interface 360). As described with respect to the first array 340 of solder bumps 342, a flux may be applied to the bump interfaces 360 before one or more solder balls are positioned over the bump interfaces 360. Once positioned, the solder balls are subjected to a suitable reflow process to form solder bumps 365. In one or more implementations, the segmented semiconductor devices may comprise wafer chip-scale package devices.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A semiconductor device comprising:
   a substrate having a first surface and a second surface, the substrate including a dielectric layer, an alignment mark for alignment of a carrier wafer with the substrate, an etch stop disposed within the substrate, and one or more integrated circuit devices formed therein;
   a first array of solder bumps disposed over the first surface;
   a second array of solder bumps disposed over the second surface; and
   a via extending from about the second surface through the dielectric layer to the etch stop,
   wherein at least one of the integrated circuit devices is electrically connected to at least one solder bump of the second array of solder bumps through the via.

2. The semiconductor device as recited in claim 1, further comprising a conductive material disposed at partially within the via region and at least partially over the second surface.

3. The semiconductor device as recited in claim 1, further comprising a redistribution structure disposed over the first surface to provide an electrical connection between at least one solder bump of the first array of solder bumps and at least one integrated circuit device of the one or more integrated circuit devices.

4. The semiconductor device as recited in claim 1, further comprising the carrier wafer bonded to the substrate, the carrier wafer for providing mechanical support to the substrate.

5. The semiconductor device as recited in claim 1, further comprising:
   an integrated circuit die disposed over at least one solder bump of the second array of solder bumps;
   an encapsulation structure disposed over the second surface of the substrate to at least substantially encapsulate the integrated circuit die; and
   a stiffener disposed over the encapsulation structure to furnish mechanical support to the substrate.

6. The semiconductor device as recited in claim 5, wherein the stiffener comprises an Alloy 42 composition.

* * * * *